United States Patent
Mandelman et al.

(10) Patent No.: US 6,576,945 B2
(45) Date of Patent: Jun. 10, 2003

(54) STRUCTURE AND METHOD FOR A COMPACT TRENCH-CAPACITOR DRAM CELL WITH BODY CONTACT

(75) Inventors: Jack A. Mandelman, Stormville, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/777,576

(22) Filed: Feb. 5, 2001

(65) Prior Publication Data

US 2002/0105019 A1 Aug. 8, 2002

(51) Int. Cl.[7] .................. H01L 27/108; H01L 29/76; H01L 29/94; H01L 31/119
(52) U.S. Cl. ........................ 257/301; 257/302
(58) Field of Search ............... 257/295–310; 438/241–253

(56) References Cited

U.S. PATENT DOCUMENTS 5,177,576 A    1/1993  Kimura et al.
5,477,071 A  * 12/1995  Hamamoto et al. ......... 257/302
6,144,054 A   11/2000  Agahi et al.
6,391,705 B1 *  5/2002  Hsiao et al. ................. 438/243

OTHER PUBLICATIONS

Radens, C., et al., "An Orthogonal 6F2 Trench–Sidewall Vertical Device Cell for 4Gb/16Gb DRAM", 2000 IEEE.

* cited by examiner

Primary Examiner—Cuong Quang Nguyen
(74) Attorney, Agent, or Firm—Scully, Scott, Murphy & Presser; Todd M.C. Li

(57) ABSTRACT

A compact DRAM cell array that substantially minimizes floating-body effects and device-to-device interactions is disclosed. The compact DRAM cell array includes a plurality of annular memory cells that are arranged in rows and columns. Each annular memory cell includes a vertical MOSFET and an underlying capacitor that are in electrical contact to each other through a buried-strap outdiffusion region which is present within a portion of a wall of each annular memory cell such that the portion partially encircles the wall. The remaining portions of the wall of each annular memory cell have a body contact region that serves to electrically connect the annular memory cell to an adjacent array well region. The DRAM cell array also includes a plurality of wordlines overlaying the vertical MOSFETs, and a plurality of bitlines that are orthogonal to the plurality of wordlines.

14 Claims, 19 Drawing Sheets

STRUCTURE AND METHOD FOR A COMPACT TRENCH-CAPACITOR DRAM CELL WITH BODY CONTACT

DESCRIPTION

1. Field of the Invention

The present invention relates to semiconductor devices, and more particularly to a trench-capacitor vertical dynamic random access memory (DRAM) cell array in which floating-body effects have been substantially minimized. Moreover, the present invention provides a trench-capacitor vertical DRAM cell array having a compact cell structure wherein device-to-device interactions in the array regions have been reduced.

2. Background of the Invention

As conventional vertical DRAM cells are scaled below a design groundrule of about 110 nm, encroachment of the buried-strap region upon the sidewall of the adjacent storage trench cuts-off the path of holes flowing into and out of the portion of the P-well above the buried-strap region causing the device to exhibit a floating-body (i.e., well) effect.

Simulation has demonstrated that floating-well effects limit the scalability of prior art vertical DRAM arrays to a minimum distance of about 90 nm between adjacent storage trenches. A number of dynamic leakage mechanisms limiting the scalability of conventional vertical DRAM cells have been identified and quantified. Included in the dynamic leakage mechanisms are: (1) Floating-well bitline disturb (FWBD), (2) Transient drain induced barrier lowering (TDIBL), and (3) Adjacent wordline induced punchthrough (AWIPT).

The onset of serious charge loss due to each mechanism occurs at approximately 90 nm end of process deep trench (DT) to deep trench (DT) spacing. Thus, scalability of conventional vertical DRAM cells below a characteristic lithographic feature size "F" of 110 nm is expected to be limited by floating-well effects.

For aggressively scaled vertical metal oxide semiconductor field effect transistors (MOSFETs) in prior art vertical DRAM cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in "Floating-Body Concerns for SOI Dynamic Random Access Memory (DRAM)", Proceedings, 1996 IEEE International SOI Conference, Jack Mandelman, et al. pp. 1367–137, October 1996.

Conventional vertical DRAM cells, such as disclosed in U.S. Pat. No. 5,177,576 to Kimura, et al. and U.S. Pat. No. 6,144,054 to Agahi, et al., are problematic since they do not (i) provide for a compact sub-8F² area cell; (ii) prevent the interaction between adjacent storage cells and transistors; and (iii) prevent full depletion of majority carries from the metal oxide semiconductor field effect transistor (MOSFET) substrate and hence prevent floating body effects.

In view of the drawbacks mentioned hereinabove with conventional vertical DRAM cells, there is a continued need for developing a new and improved memory cell array which address items (i)–(iii) mentioned hereinabove.

SUMMARY OF THE INVENTION

One object of the present invention is to provide a vertical DRAM cell array that substantially eliminates floating-well effects that are typically present in conventional vertical memory cell arrays.

Another object of the present invention is to provide a vertical DRAM cell array in which device-to-device interactions in the array have been substantially reduced.

A further object of the present invention is to provide a vertical DRAM cell array that has a compact cell structure that enables the fabrication of a sub-8F² area cell.

A further object of the present invention is to provide a vertical DRAM cell array which substantially prevents full depletion of majority carriers from the MOSFET substrate and hence substantially prevents floating-body effects.

These and other objects and advantages are achieved in the present invention by providing a DRAM cell array having the substrate body active areas formed as annular rings using the deep trench (DT) capacitor pattern. The active area annular rings, which are formed self-aligned to the DT pattern, provide dielectric isolation between adjacent cells to prevent interaction between bodies and the source/drain capacitor diffusions. Moreover, in the inventive DRAM cell array, a body contact is provided along one-side of the active area annulus opposite a single-sided buried-strap contact. The inventive body contact is comprised of a region in the silicon active area annulus where there is no formation of the buried-strap outdiffusion, and hence a direct electrical connection between the array well and the device body is provided.

One aspect of the present invention thus relates to a DRAM cell array which comprises:

a plurality of annular memory cells which are arranged in rows and columns, each annular memory cell including a vertical MOSFET and an underlying capacitor that are in electrical contact to each other through a buried-strap outdiffusion region which is present within a portion of a wall of each annular memory cell such that said portion partially encircles the wall, the remaining portions of said wall of each annular memory cell have a body contact region which serves to electrically connect said annular memory cell to an adjacent array well region;

a plurality of wordlines overlaying said vertical MOSFETs, said plurality of wordlines being arranged in said row direction; and a plurality of bitlines that are orthogonal to said plurality of wordlines.

In one embodiment of the present invention, buried-strap outdiffusion regions of adjacent annular memory cells that are arranged in the column direction are facing each other. In another embodiment of the present invention, the buried-strap outdiffusion regions of adjacent annular memory cells that are arranged in the column direction are not facing each other. In yet another embodiment of the present invention, a staggered arrangement is provided. In the staggered arrangement, buried-strap outdiffusion regions of adjacent annular memory cells in the column direction are facing each other, whereas the neighboring pair of annular memory cells in the row direction have buried-strap outdiffusion regions that are not facing each other.

The present invention also provides a method of forming the above-mentioned vertical DRAM cell array. Specifically, the method of the present invention comprises the steps of:

(a) forming a plurality of deep trenches in an array portion of a Si-containing substrate having at least a hard mask formed thereon, said plurality of deep trenches being arranged in rows and columns and including at least collar oxide regions formed on walls thereof and a recessed deep trench conductor formed between said collar oxide regions;

(b) forming a buried-strap outdiffusion region within a portion of said wall such that said portion partially encircles said wall;

(c) forming vertical MOSFETs in said plurality of deep trenches above said recessed deep trench conductor, each MOSFET having an insulating capping layer formed thereon;

(d) removing said hard mask abutting said plurality of deep trenches so as to expose sidewall portions of said MOSFETs, and forming diffusion regions in said Si-containing substrate;

(e) forming sidewall masking layers on said diffusion regions so as to cover exposed sidewall portions of said MOSFETs;

(f) etching through exposed diffusion regions and a portion of said Si-containing substrate not protected by said insulating capping layer and said sidewall masking layers so as to electrically isolate adjacent buried-strap outdiffusion regions from each other and to form annular active areas adjacent to said plurality of deep trenches;

(g) forming a mandrel material in said etched areas as well as over said insulating cap layer;

(h) forming wordlines which overlay said MOSFETs in said row direction;

(i) removing a portion of said mandrel material between adjacent deep trenches and forming bitline contacts in place thereof; and (j) forming bitlines over said wordlines, wherein said bitlines are orthogonal to said wordlines.

In an alternative embodiment of the present invention, the hard mask is subjected to an isotropic etching process prior to forming the insulating capping layer over the MOSFETs so as to form a wide gate overhang region in the structure.

DETAILED DESCRIPTION OF THE INVENTION

Figure 1:
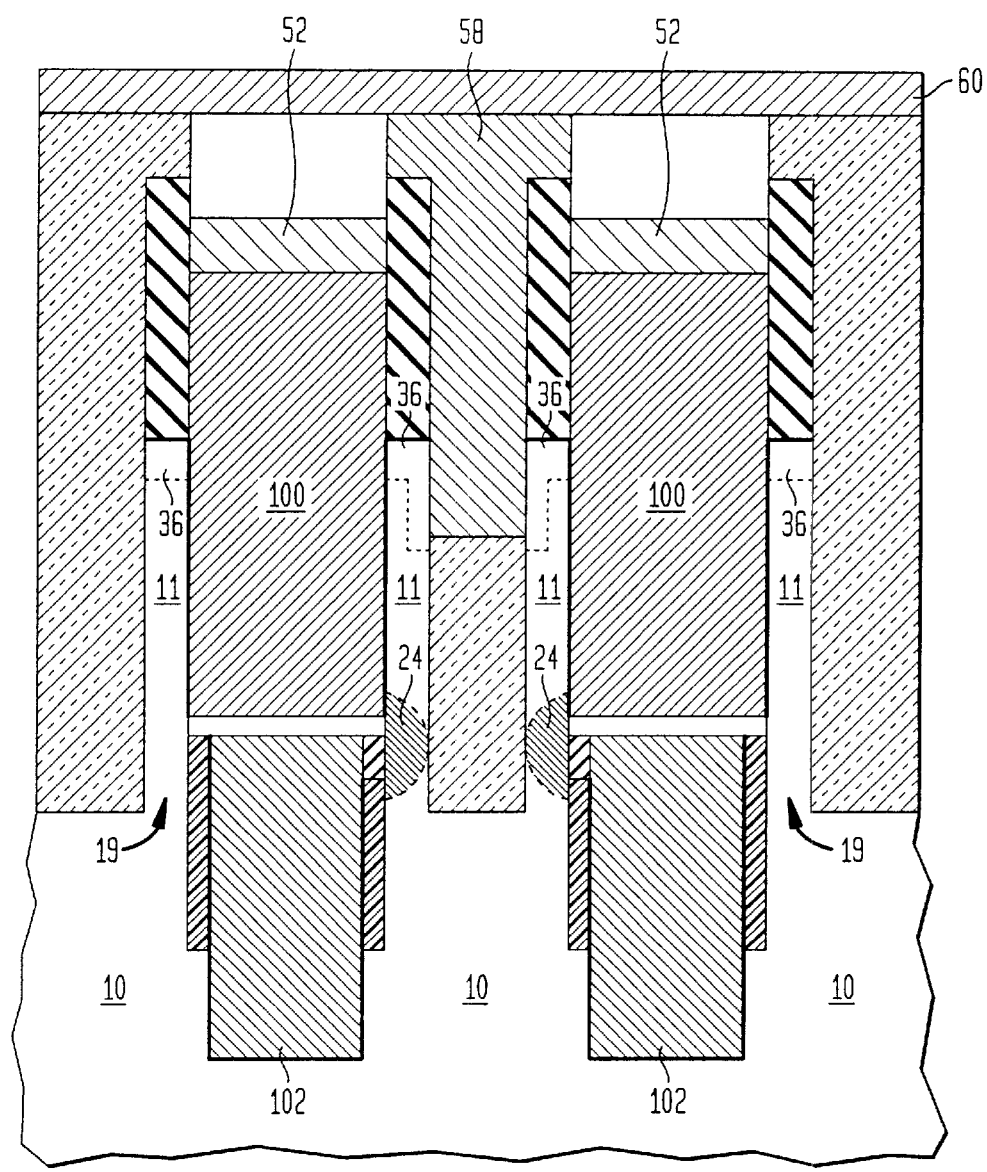
FIG. 1 is a cross-sectional view of the inventive vertical DRAM cell array.

The present invention which provides a method of forming a vertical DRAM cell array having a compact memory cell and a body contact will now be described in more detail by referring to the drawings that accompany the present application. It is noted that in the accompanying drawings, like and/or corresponding elements are referred to by like reference numerals.

Reference is first made to FIG. 1 which illustrates a cross-sectional view of the inventive vertical DRAM cell array. Specifically, FIG. 1 comprises a portion of a vertical DRAM cell array that includes a plurality of annular memory cells which are arranged in rows and columns. Each annular memory cell includes vertical MOSFET 100 and underlying capacitor 102 that are in electrical contact to each other through buried-strap outdiffusion region 24. As shown, the buried-strap outdiffusion region is present within a portion of a wall of each annular memory cell such that the portion partially encircles the wall, the remaining portions of said wall of each annular memory cell have body contact region 19 which serves to electrically connect said annular memory cell to adjacent array well region 11.

The DRAM cell array of FIG. 1 also includes a plurality of wordlines 52 overlaying the vertical MOSFETs. The wordlines are arranged in the row direction. The inventive array also includes a plurality of bitlines 60 (one of which is shown in FIG. 1) that are orthogonal to the plurality of wordlines 52.

In addition to the above elements, the inventive DRAM array includes diffusion regions 36 that are formed above the well regions and bitline contact regions 58 that are formed between adjacent MOSFETs. Note that in FIG. 1 the bitline contact cuts the adjacent buried-strap outdiffusion regions so that those outdiffusion regions are electrical isolated from each other. The other elements that are present in the inventive DRAM cell array that are not labeled in FIG. 1 will be described in more detail in reference to FIGS. 6A–M.

It is noted that in the inventive DRAM cell array the body of each vertical MOSFET is contained within a cylindrical shell within the semiconductor substrate such that the cross-section of each vertical MOSFET in a plane perpendicular to the axis of the cylindrical shell is an annulus. Moreover, the underlying capacitor formed in the lower portion of the deep trenches does not have an annular cross-section.

Figure 2:
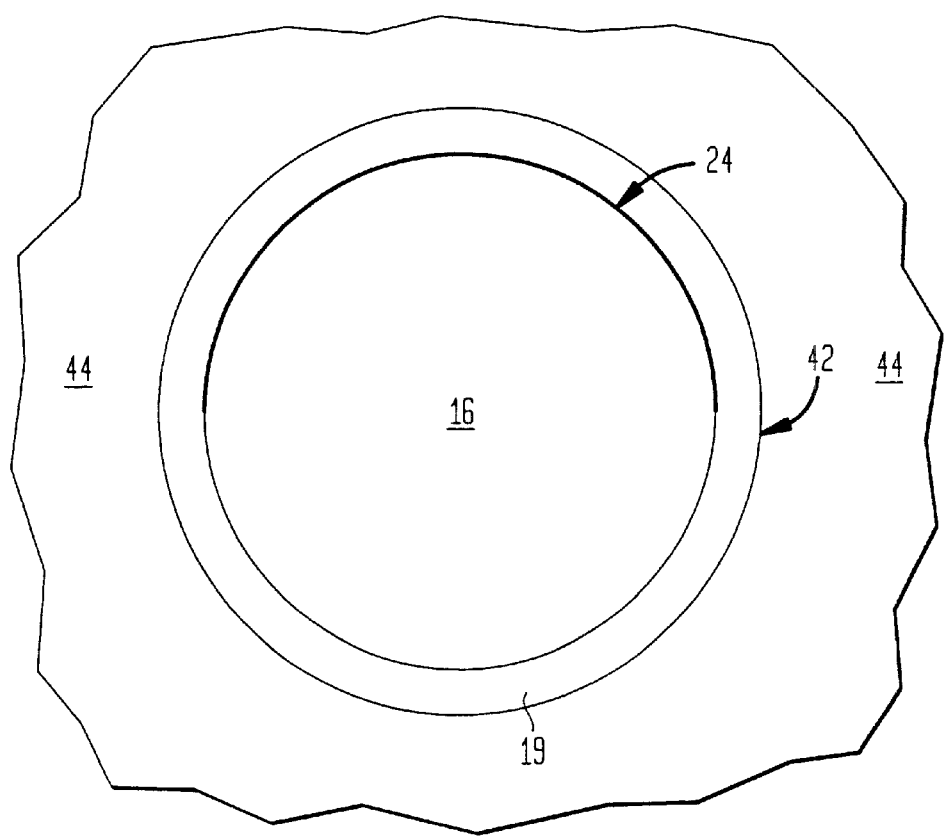
FIG. 2 is a simplified top view of the inventive vertical DRAM cell capacitor, buried-strap and body contact.

FIG. 2 shows a top-down view of one-storage capacitor active area, buried-strap and body contact of the present invention. Note that FIG. 2 includes trench isolation regions 44 that surround the annular memory cell. As shown, the annular memory cell includes deep trench region 16 having buried-strap outdiffusion region 24 present within a portion of a wall of the deep trench, the remaining portion of the wall has body contact region 19 formed thereon. Surrounding the deep trench is active area annulus 42 of the cell.

Figure 3:
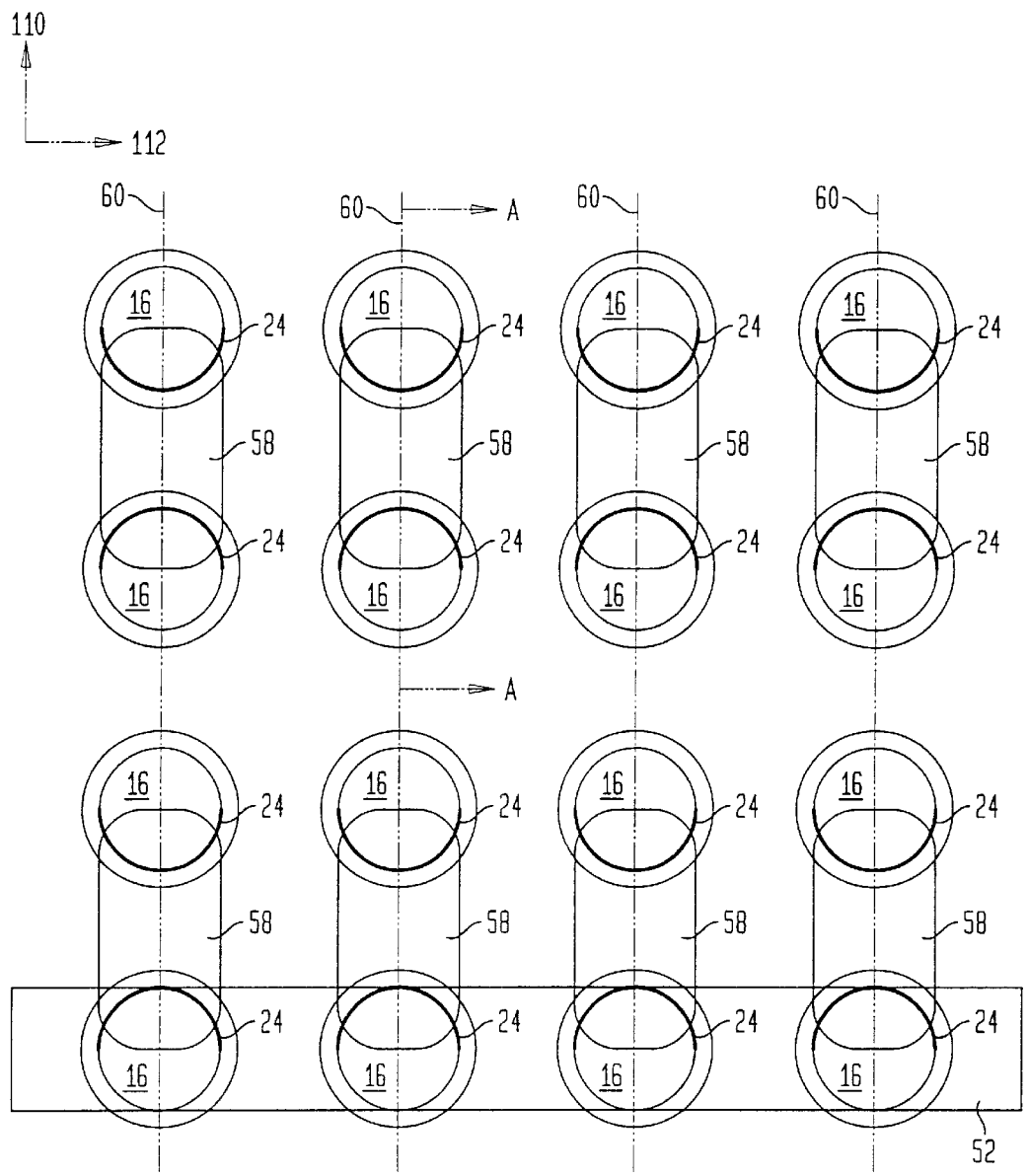
FIG. 3 is a top view of one alternative vertical DRAM cell array of the present invention wherein the buried-strap outdiffusion regions of adjacent annular memory cells that are arranged in the column direction are facing each other.

FIG. 3 shows a top view of one alternative vertical DRAM cell array of the present invention wherein buried-strap outdiffusion regions 24 of adjacent annular memory cells that are arranged in the column direction are facing each other. In this drawing, as well as FIGS. 4 and 5, reference numeral 110 denotes the column direction, whereas reference numeral 112 denotes the row direction.

Figure 4:
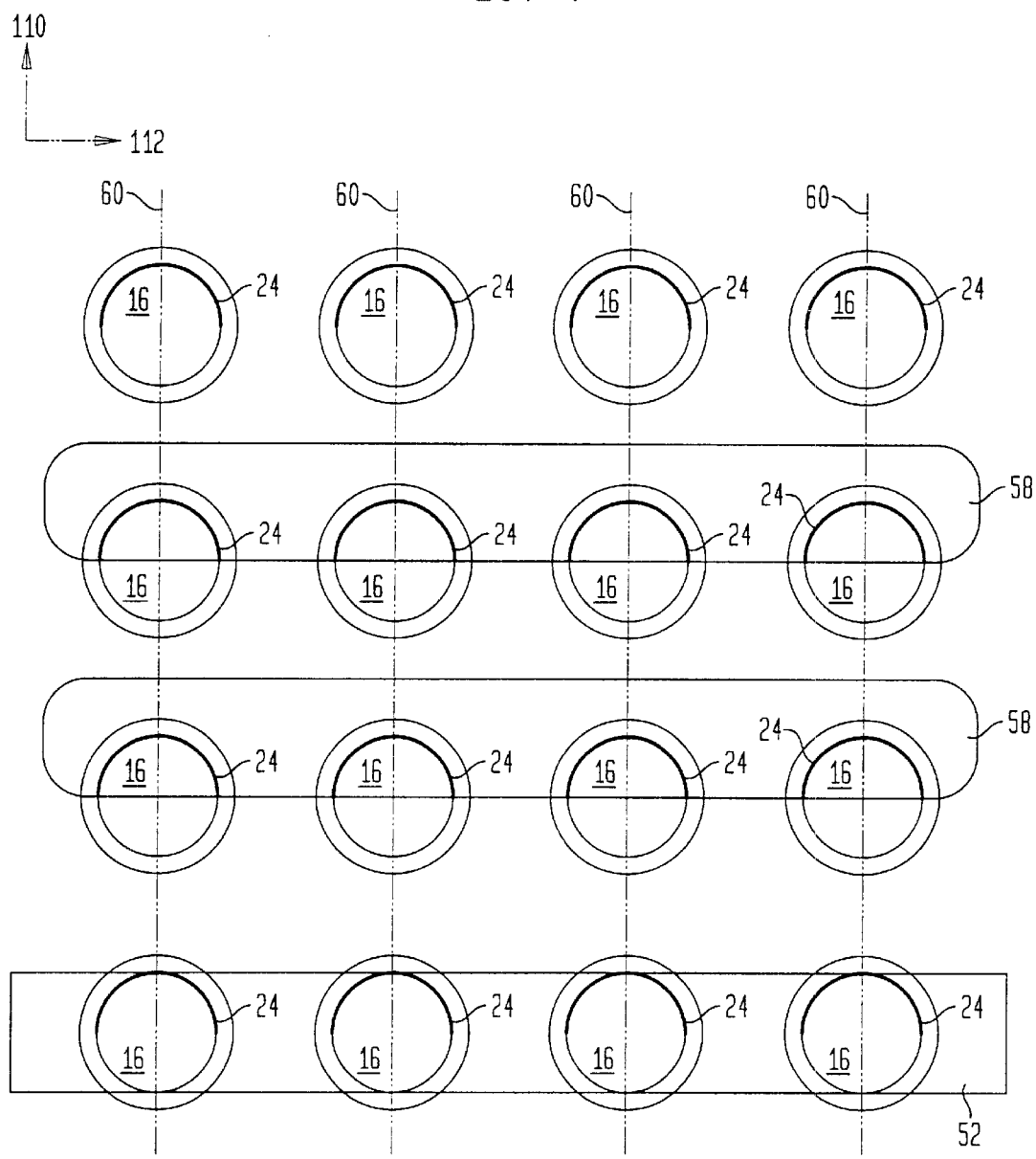
FIG. 4 is a top view of another alternative vertical DRAM cell array of the present invention wherein the buried-strap outdiffusion regions of adjacent annular memory cells that are arranged in the column direction are not facing each other.

FIG. 4 is a top view of another alternative vertical DRAM cell array of the present invention wherein buried-strap outdiffusion regions 24 of adjacent annular memory cells that are arranged in the column direction are not facing each other.

Figure 5:
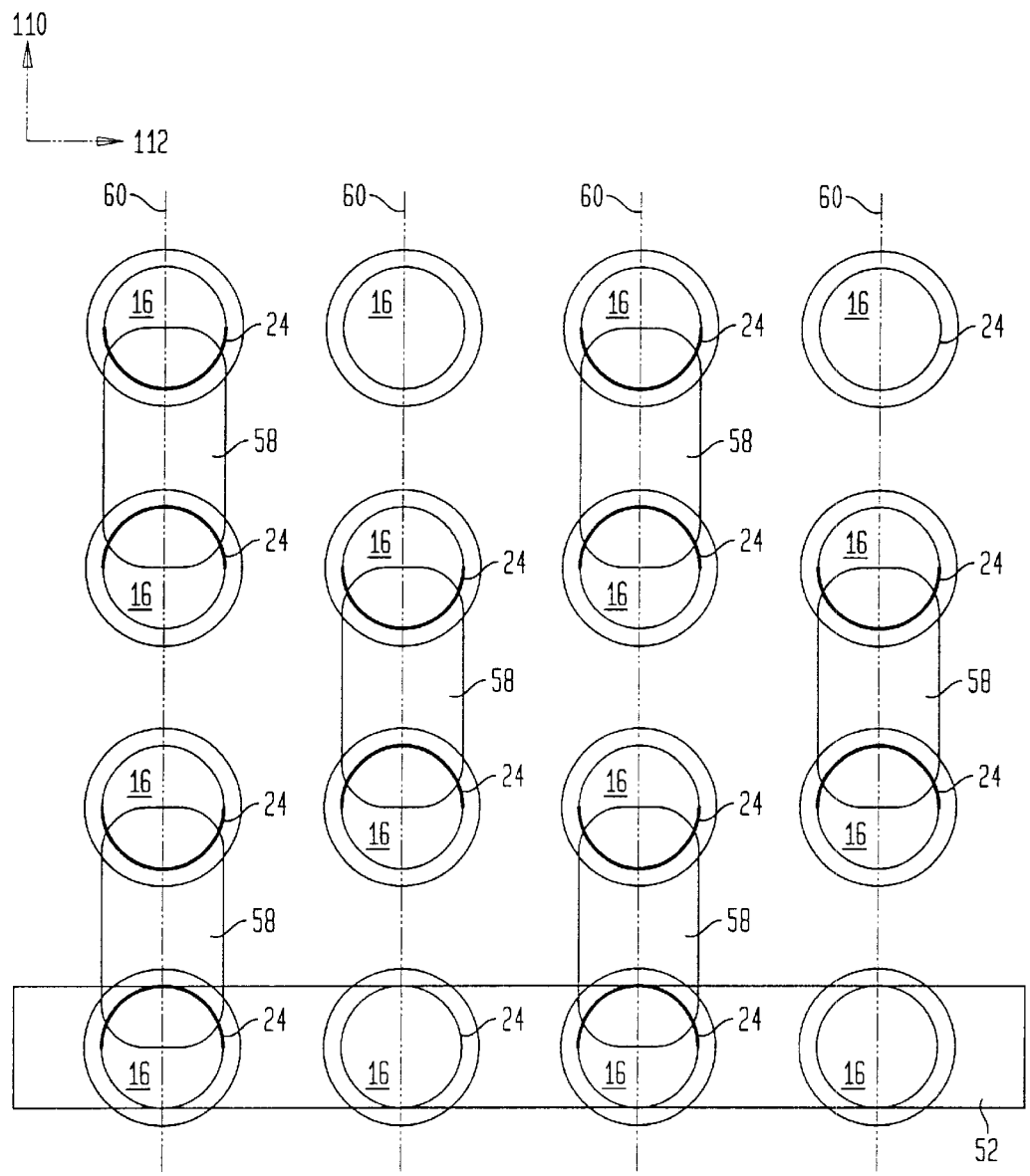
FIG. 5 is a top view of yet another alternative vertical DRAM cell array of the present invention wherein the buried-strap outdiffusion regions of adjacent annular memory cells that are arranged in the column direction are facing each other, whereas the neighboring pair of annular memory cells in the row direction have buried-strap outdiffusion regions that are not facing each other.

FIG. 5 is a top view of yet another alternative vertical DRAM cell array of the present invention wherein buried-strap outdiffusion regions 24 of adjacent annular memory cells that are arranged in the column direction are facing each other, whereas the neighboring pair of annular memory cells in the row direction have buried-strap outdiffusion regions 24 that are not facing each other.

Figure 6A:
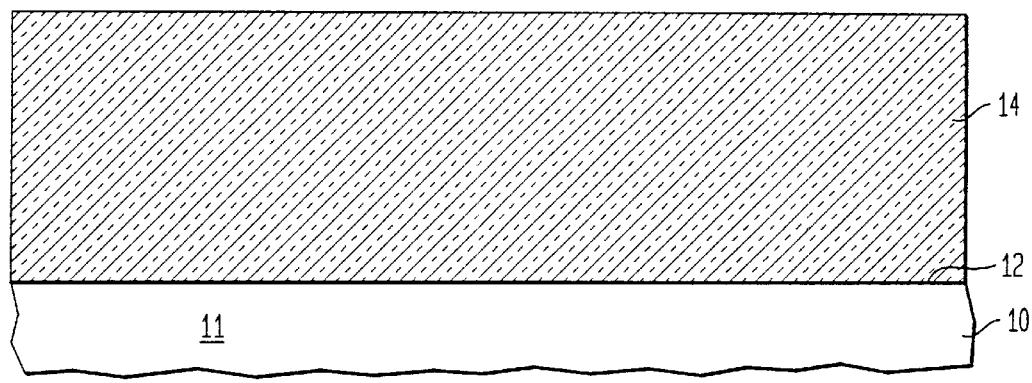
FIGS. 6A–M are cross-sectional views of the inventive vertical DRAM cell array through various processing steps of the present invention.

The processing scheme, which is employed in the present invention in forming the above-described vertical DRAM cell arrays, will now be described in more detail by referring to FIGS. 6A–M, which illustrate the various processing steps of the present invention. Reference is first made to FIG. 6A which shows an initial structure that is employed in the present invention in fabricating the inventive vertical DRAM cell array. Specifically, FIG. 6A shows an array portion of the structure that includes Si-containing substrate 10 having a material stack comprising an etch stop pad layer 12 and a hard mask 14 formed thereon. The substrate may include well regions 11, or the well regions may be formed later in the inventive process.

The structure shown in FIG. 6A is made from conventional materials that are well known to those skilled in the art and conventional processes also well known in the art are employed in fabricating the same. For example, etch stop pad layer 12 may be composed of an oxide such as $SiO_2$ and is formed on a surface of Si-containing substrate utilizing a conventional thermal growing process and thereafter hard mask 14, e.g., SiN, is formed on etch stop pad layer 12 by a conventional deposition process such as chemical vapor deposition (CVD), plasma-assisted CVD, sputtering, or chemical solution deposition. The thickness of each layer of the material stack may vary and is not critical to the present invention. Typically, however, the etch stop pad layer has a thickness of about 5 nm or less and the hard mask has a thickness of from about 10 to about 1000 nm.

Figure 6B:
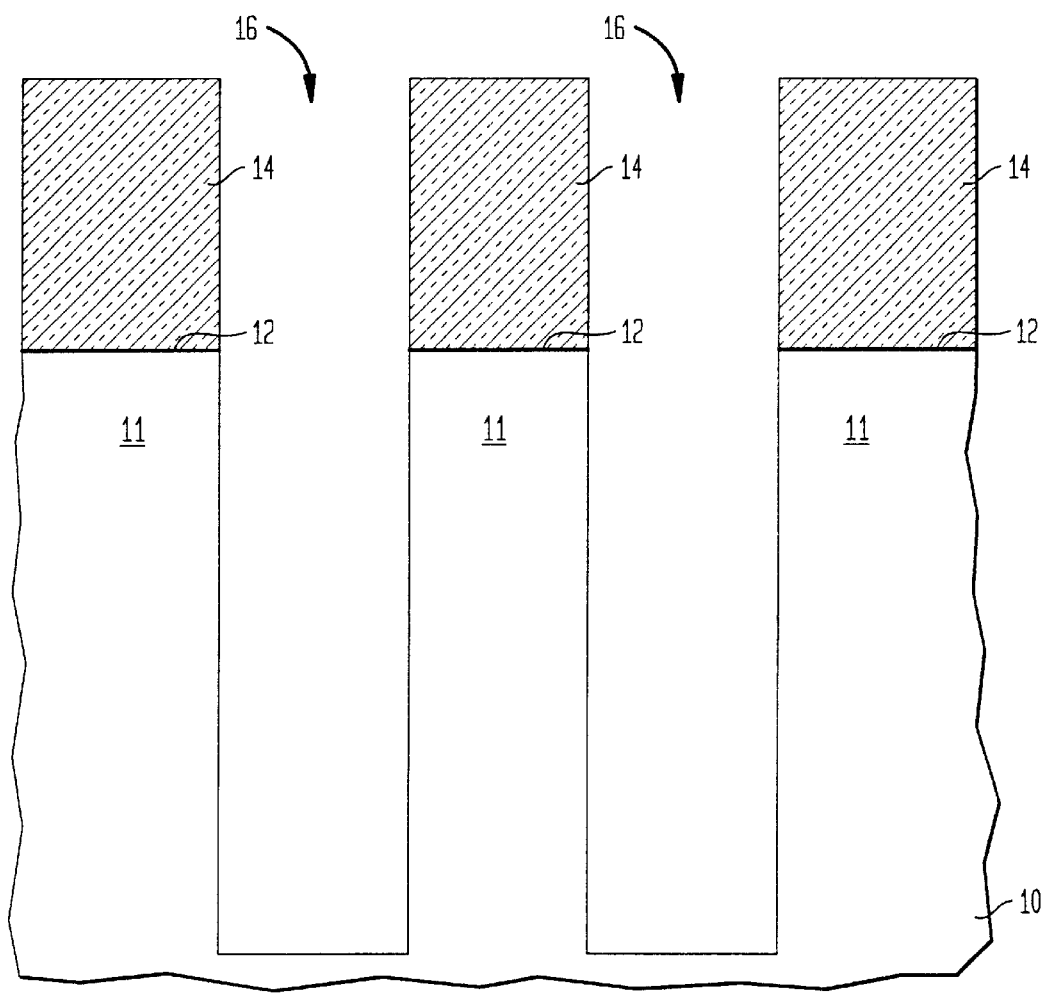

Next, deep trenches 16 are formed in the structure shown in FIG. 6A providing the structure shown in FIG. 6B. The term "deep trench" is used herein to denote a trench whose depth from the top surface of Si-containing substrate 10 is from about 1.0 µm or greater. The deep trenches are formed in the conventional manner of opening a trench pattern extending through the hard mask, the etch stop pad layer and a portion of the Si-containing substrate via lithography and anisotropic etching. Note deep trenches 16, which are formed in rows and columns into the Si-containing substrate, are the areas in which the storage capacitor and vertical MOSFETs are formed.

Figure 6C:
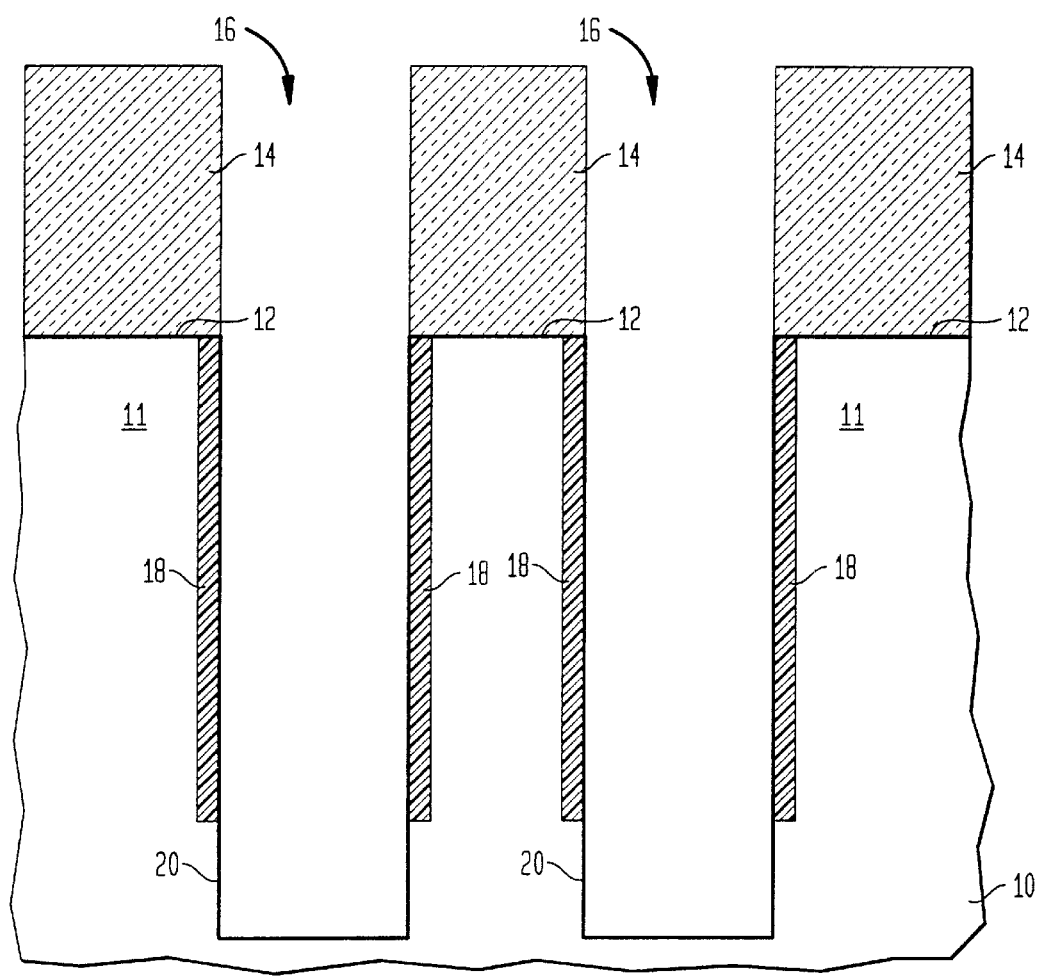

A polysilicon buffered LOCOS (local oxidation of silicon) collar or other like collar oxide 18 is then formed in a portion of the deep trench, See FIG. 6C. Next, a capacitor (not shown in the drawings) is formed in the lower portion of the deep trench utilizing conventional processing steps well known to those skilled in the art. Included in the deep trench-processing steps is the formation of a buried plate diffusion region (not shown) and formation of node dielectric 20 about said buried plate diffusion region. As shown in FIG. 6C, node dielectric 20 extends from the lower portion of the deep trench to the upper surface of the deep trench and is formed on walls thereof. In the upper portion of the deep trench, the node dielectric serves as an etch stop pad layer during the formation of the buried-strap region. In the lower portion of the deep trench, the node dielectric separates the buried plate diffusion region from the deep trench conductor.

Figure 6D:
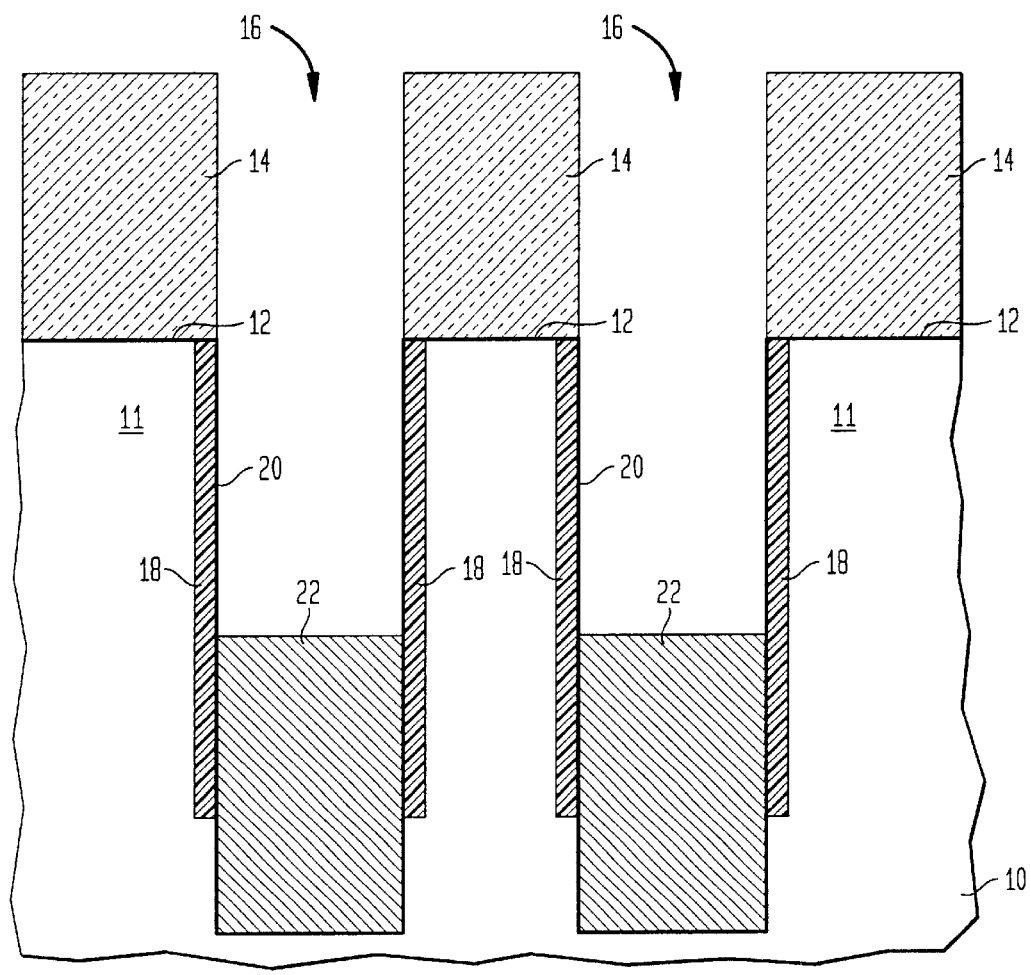

The node dielectric, which is composed of a conventional dielectric material such as SiN, is formed by conventional deposition processes such as CVD, plasma-assisted CVD, sputtering, and the like. The deep trench is then filled with deep trench conductor 22 such as polysilicon and thereafter the deep trench conductor is recessed by conventional means to a depth which is desired for the strap (determines the channel length of the vertical MOSFET; typically of from about 100 to about 400 nm). The structure containing recessed deep trench conductor 22 is shown in FIG. 6D.

At this point of the inventive process either a masked or maskless one-sided strap (OSS) process, such as described in Radens, et al. "An Orthogonal $6F^2$ Trench-Sidewall Vertical Device Cell for 4 Gb/16 Gb DRAM", IEDM 2000 Tech. Dig., p. 349, is employed in forming buried-strap outdiffusion region 24; see FIG. 6E. Note that the OSS process does not etch one of the collar oxide regions, and on that side of structure is the area in which body contact 19 is formed. Specifically, the buried-strap outdiffusion region is formed as follows: First, an oxide layer (not shown) is formed over the recessed deep trench conductor, followed by an etch stop liner which lines the node dielectric as well as the oxide layer previously deposited and thereafter a polysilicon placeholder material (not shown in the drawings) is formed in the upper region of the deep trench covering the exposed portions of the etch stop liner. Next, a portion of the polysilicon placeholder material on the side of the deep trench where the buried-strap is desired is etched down to the etch stop liner overlying the oxide layer at the top of the recessed conductive material.

An OSS process is then performed which may include the following processing steps: removing a portion of the polysilicon placeholder material using an etch process that is selective to the etch stop liner on a side of the deep trench where a strap is to be formed; removing the exposed collar oxide by utilizing an isotropic oxide etching process; removing portions of the etch stop liner and the node dielectric that are not protected by the remaining region of the polysilicon placeholder material; removing the remaining polysilicon placeholder material; opening a portion of the oxide layer over the deep trench polysilicon not covered by the etch stop liner; continuing the oxide etching so as to form a divot in the top collar oxide at approximately the top level of the deep trench conductor; and filling the divot with a conductive material such as doped polysilicon so as to provide a bridge between the deep trench conductor and the wall of the trench. During a subsequent annealing step, dopant from the divot filled region diffuses forming buried-strap outdiffusion region 24. The divot filled collar oxide region is labeled as 26 in the drawings. Note that on the remaining wall portion of the structure not containing buried-strap outdiffusion 24 and divot filled collar oxide region 26 is an "intact" collar oxide region 18. The intact collar oxide serves to electrically isolate body contact region 19 from trench capacitor 22.

Figure 6E:
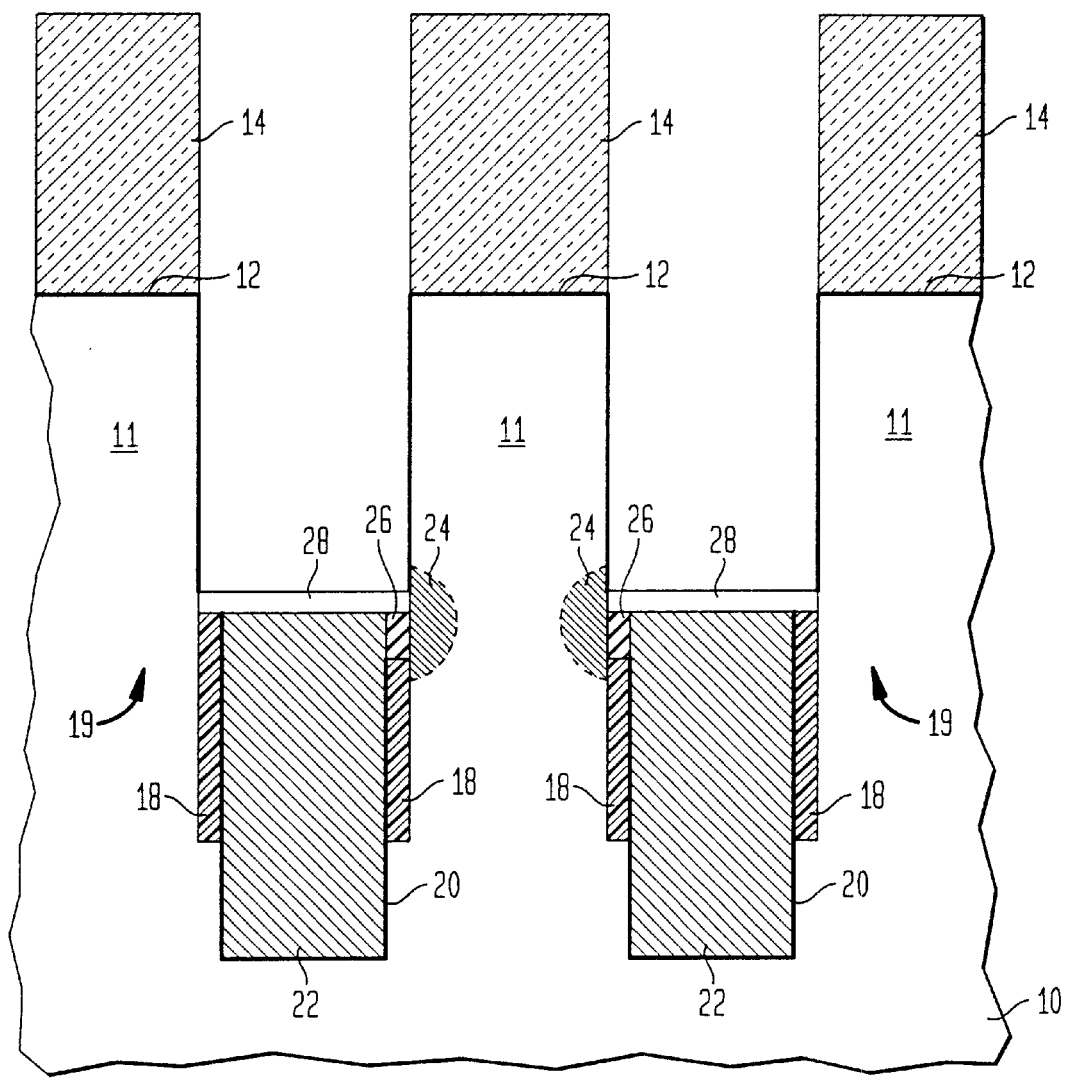

As is also shown in FIG. 6E, trench top oxide (TTO) 28 is formed on all horizontal surfaces including deep trench conductor 22 and divot filled collar oxide region 26 utilizing conventional deposition processes such as high-density plasma-assisted deposition and thereafter a conventional resist recess process is employed to remove the trench top oxide from top surfaces of the structure. A sacrificial oxide layer (not shown) is next formed and stripped utilizing conventional lithography and etching and gate dielectric 30 such as an oxide is formed on the exposed walls of the upper portion of the deep trench. The gate dielectric is formed in the present invention utilizing any well-known process such as thermal oxidation of silicon or by nitridation of an oxide. Alternatively, a deposited gate dielectric, such as by CVD or ALD (atomic layer deposition), may be formed.

Figure 6F:
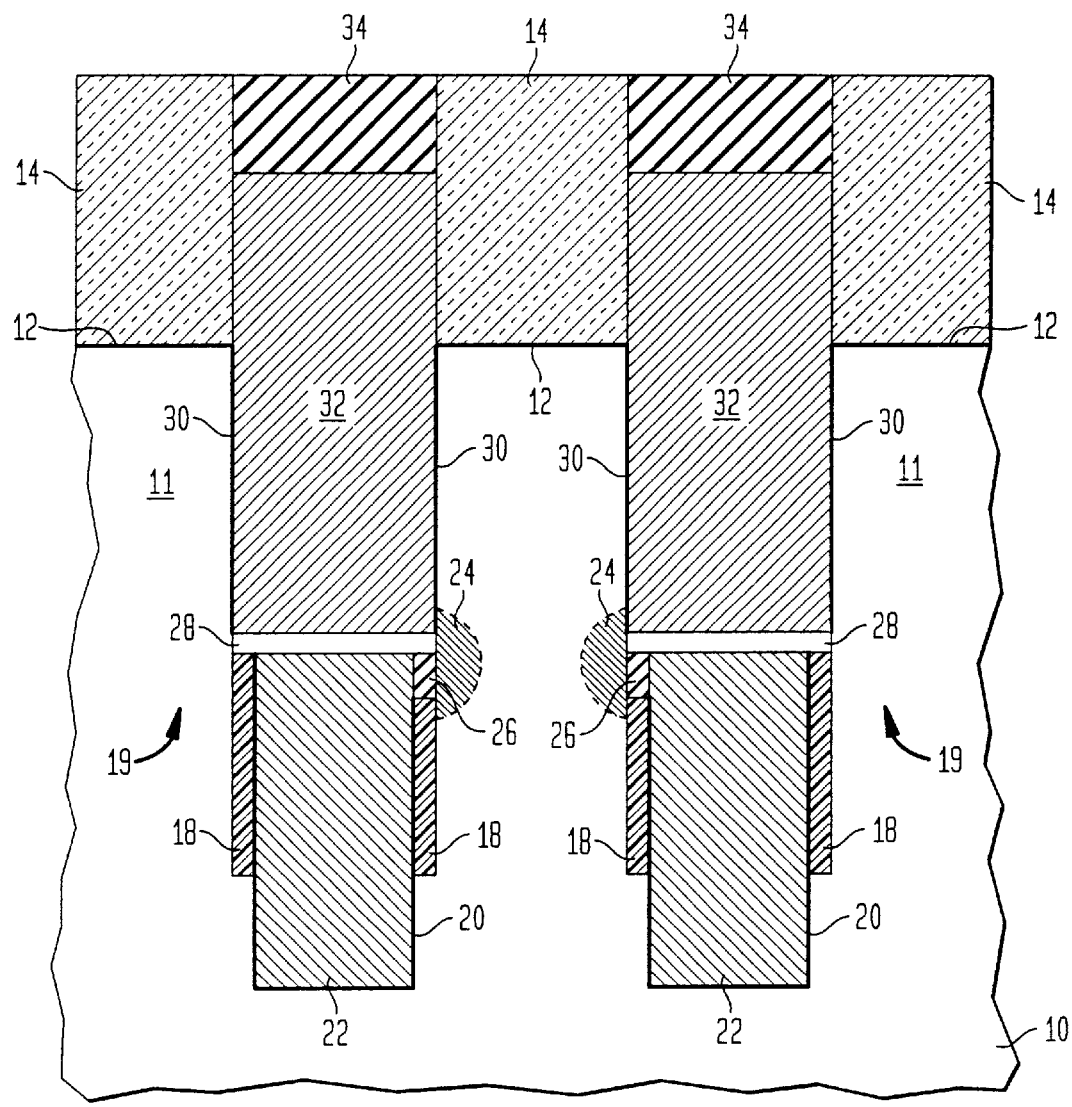

A gate conductor 32 such as doped polysilicon is then formed on top trench oxide 28, the structure is then planarized to hard mask 14 and thereafter gate conductor 32 is recessed utilizing a conventional recessing process, See FIG. 6F. An insulating capping layer 34 such as an oxide is formed on recessed gate conductor 32 utilizing a conventional deposition and planarization process. The resultant structure is also shown in FIG. 6F.

Figure 6G:
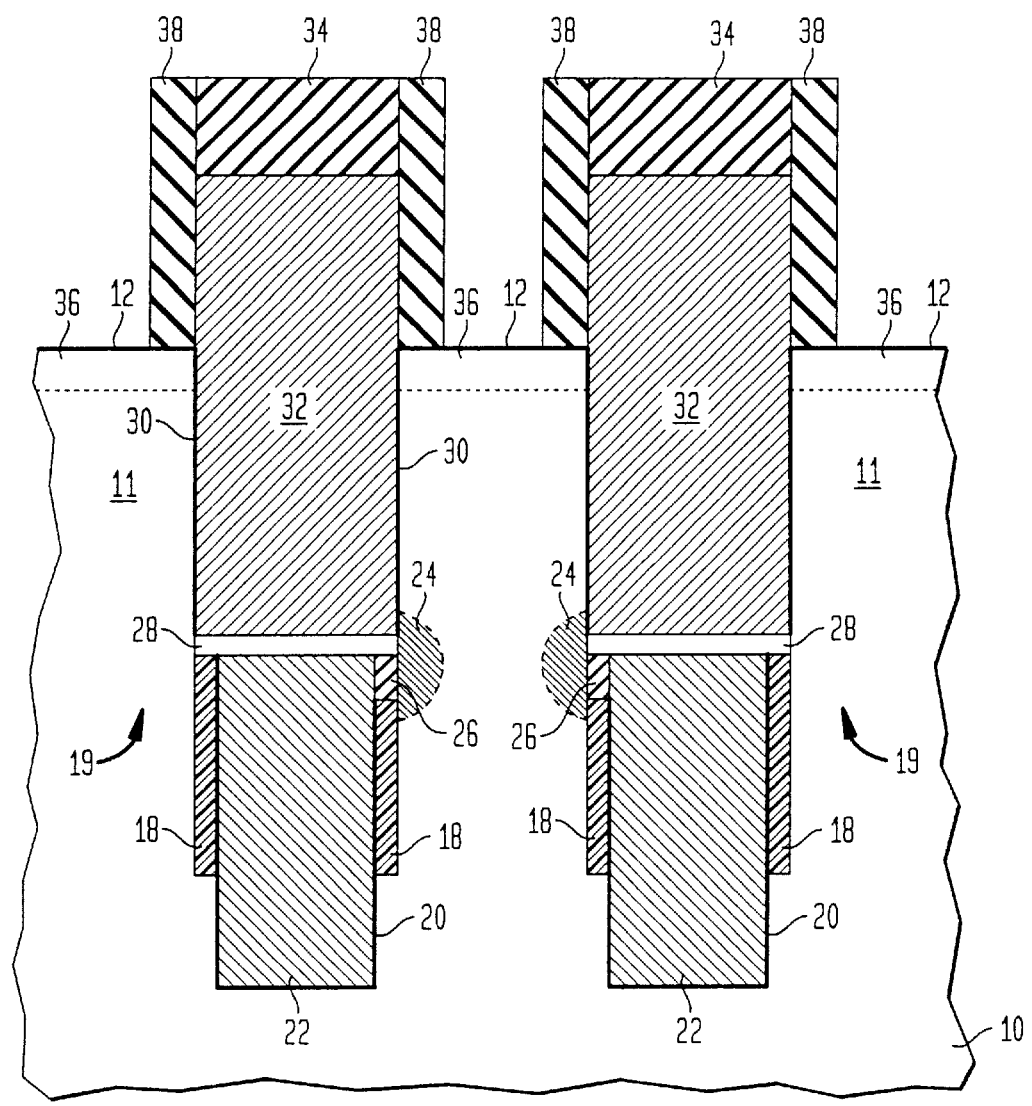

Following capping of the gate conductor, hard mask 14 is removed from the structure stopping on the underlying etch stop pad layer utilizing a conventional etching process that has a high selectivity to the hard mask. Diffusion regions 36 (which will be cut by a later etching process) are then formed in the Si-containing substrate utilizing conventional ion implantation processes well known to those skilled in the art and conventional activation annealing processes are used in activating the same. Prior to activating the diffusion regions, it is also now possible to form well regions 11 in substrate 10 by utilizing conventional ion implantation processes. After forming the diffusion regions in the substrate, sidewall masking layers 38 are formed on exposed sidewalls of insulating capping layer 34 and gate conductor 32. The sidewall masking layer is composed of an insulating material and it is formed utilizing conventional deposition and anisotropic etching processes well known to those skilled in the art. FIG. 6G shows the structure that is obtained from these processing steps.

Figure 6H:
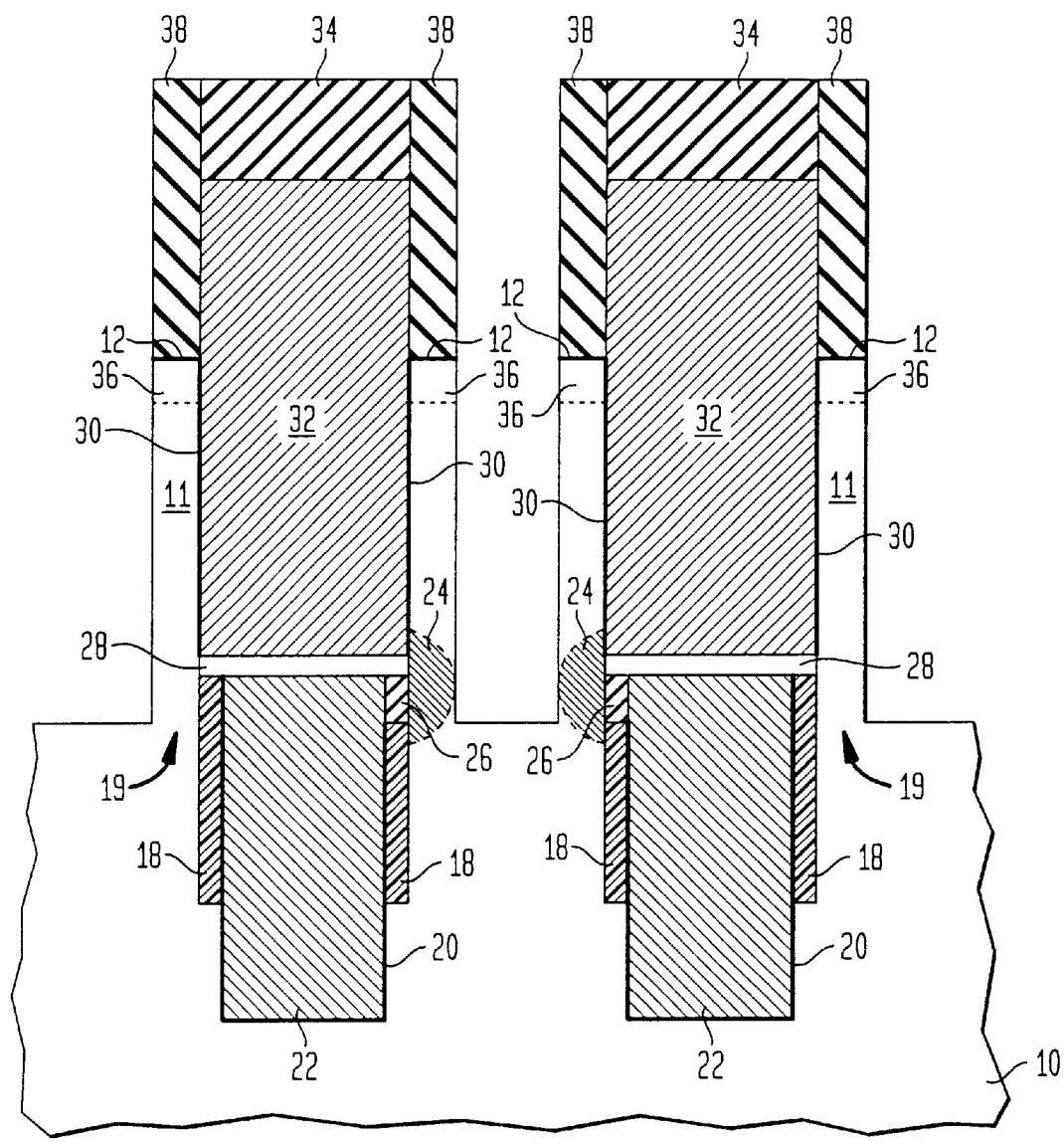

Next, as shown in FIG. 6H, portions of the structure not covered by either the sidewall masking layers or the insulating capping layer are removed stopping at a predetermined depth in the Si-containing substrate which is sufficient to electrically isolate buried-strap regions of adjacent deep trench regions. That is, this etching step of the present invention cuts adjacent buried-straps from each other and thus prevents electrical interaction between adjacent deep trench regions. Moreover, during this etching step the diffusion regions are cut and active area annulus (not shown in these drawings, but is labeled as 42 in FIG. 2) which encircle the deep trenches are formed. It is noted that during this step of the present invention, a block mask (not shown) protects the support regions.

Figure 6I:
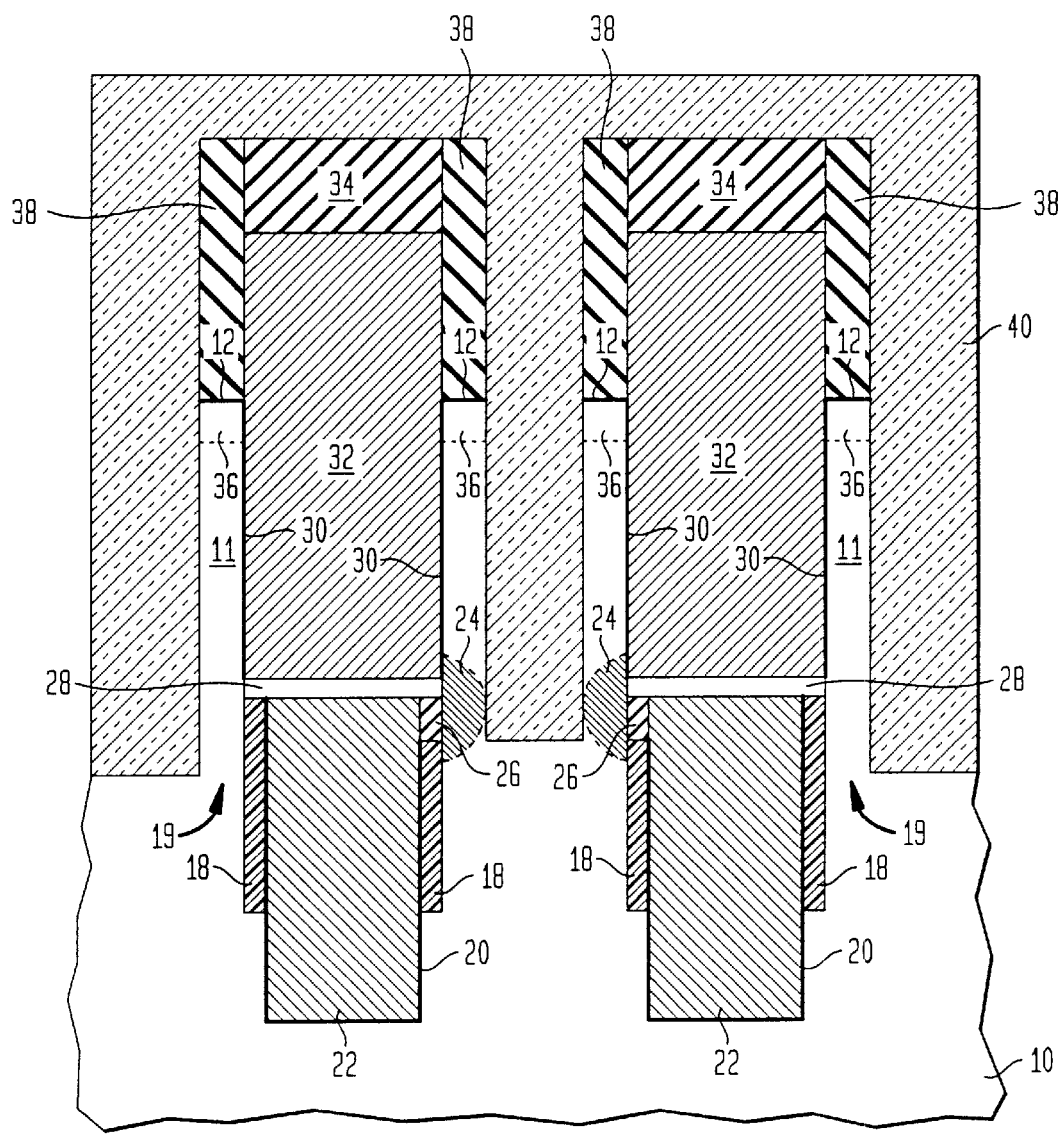
Figure 6J:
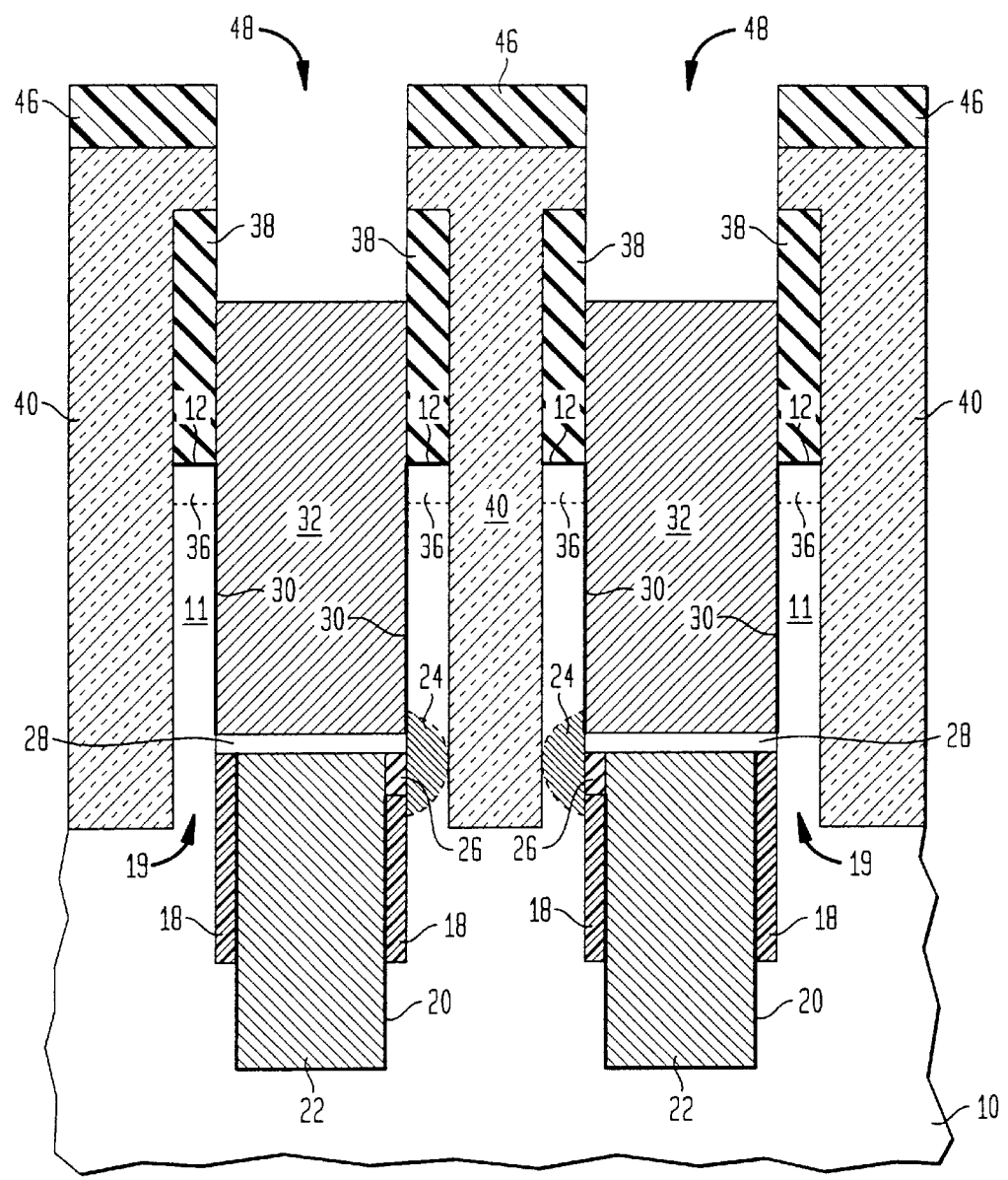

FIG. 6I show the structure that is obtained after mandrel material 40 such as a low-pressure chemical vapor deposited (LPCVD) SiN is formed in the areas of the structure that were previously etched. During this point of the present invention, isolation regions are typically formed in the array and support device regions using conventional processes well known to those skilled in the art. Note that in the array regions, isolation regions (not shown in these drawings, but are labeled as 44 in FIG. 2) encircle the active area annulus of the memory cells.

Next, a photoresist is formed on the mandrel material and is subjected to conventional lithography so as to form patterned resist 46 which has openings formed above the deep trench regions. A conventional anisotropic etching process such as RIE is then used to cut slots 48 through the openings in the patterned resist so as to remove insulating capping layer 34 from the structure as well as a portion of gate conductor 32. The resultant structure is shown, for example, in FIG. 6J.

Figure 6K:
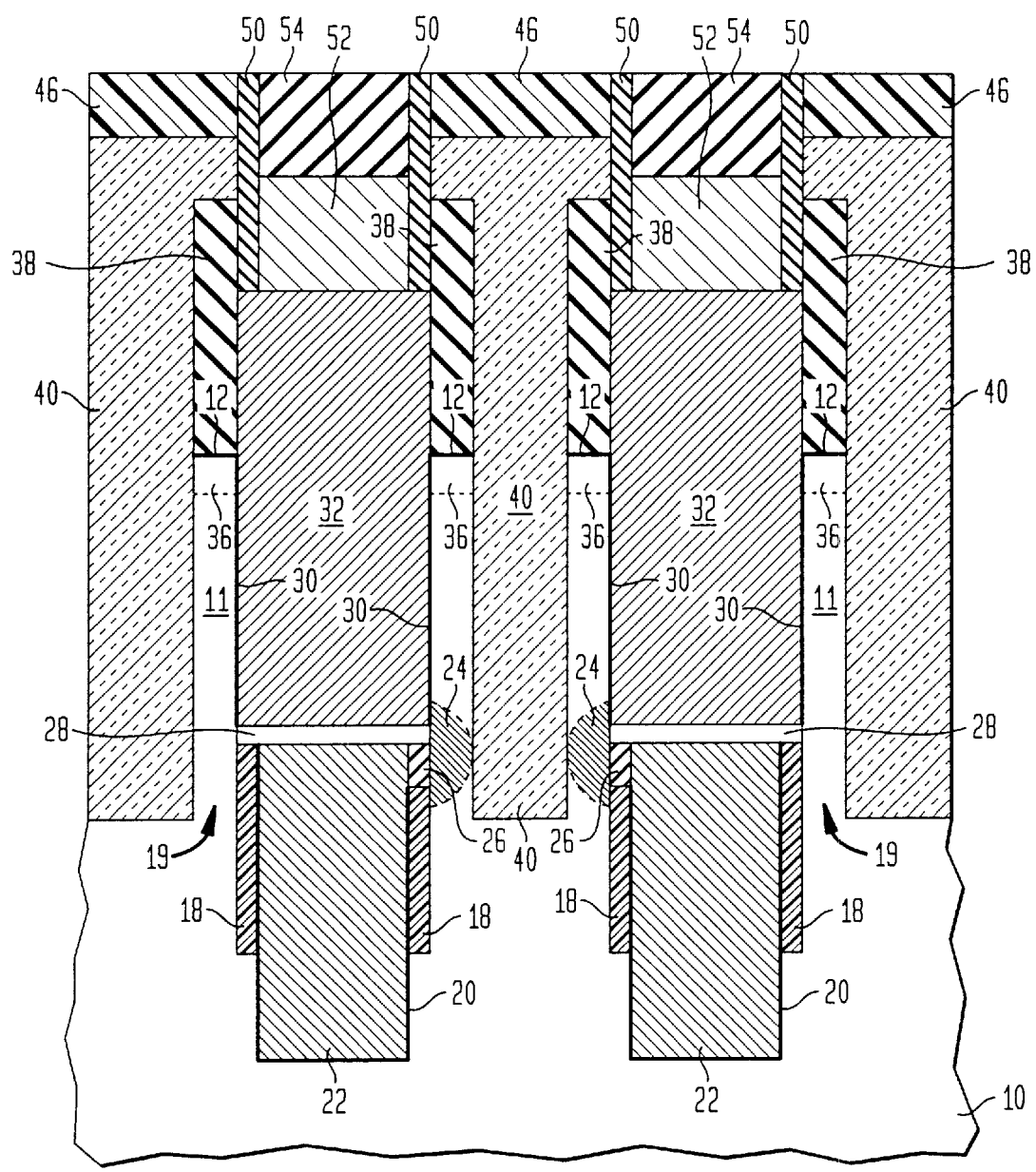
Figure 6L:
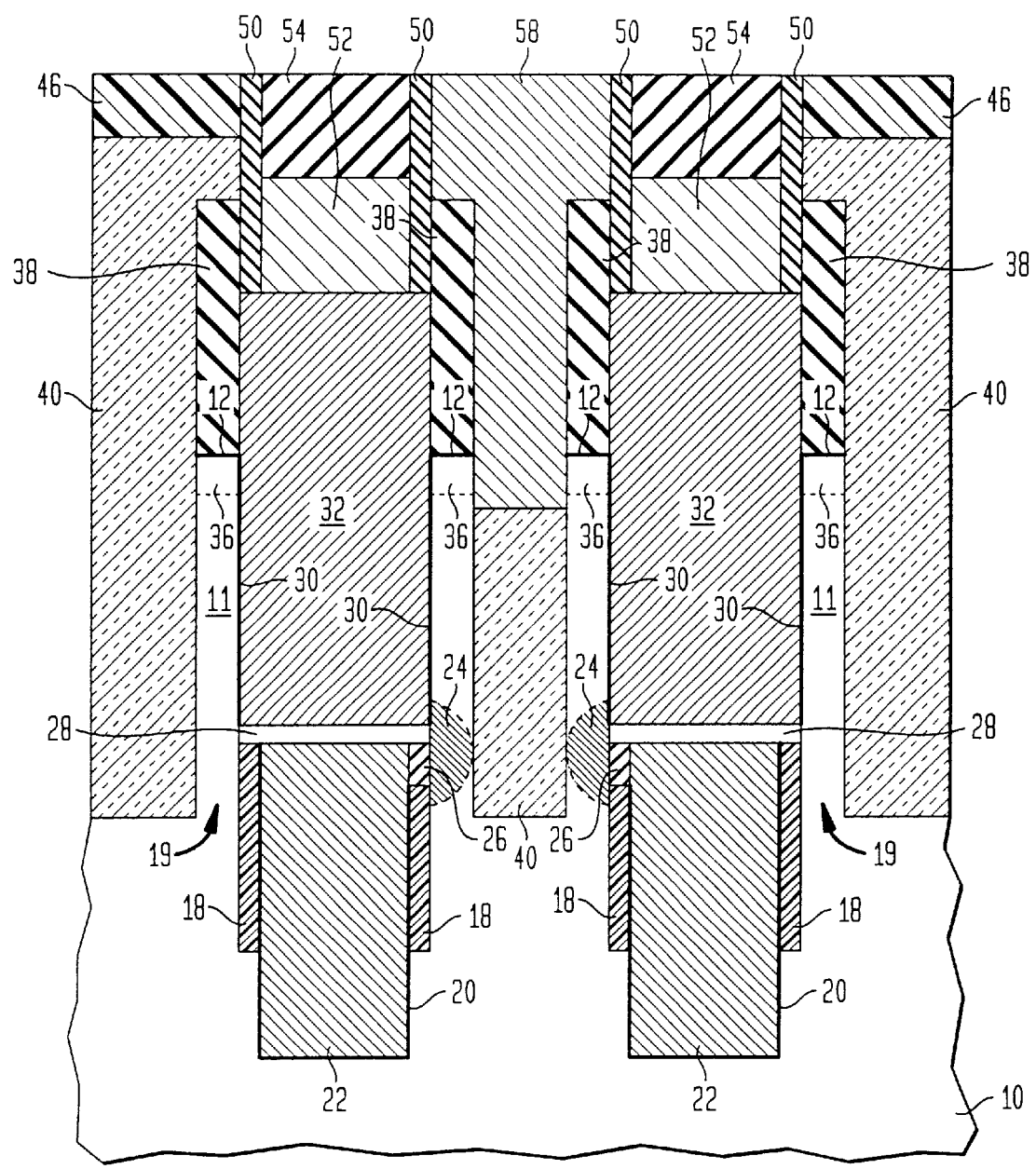

As shown in FIG. 6K, insulating spacers 50 are formed on the sidewalls of the slots and thereafter the slots are filled with a highly conductive material (labeled as 52 in the drawings) such as W/WN or polysilicon and then the conductive material is recessed using a wet or dry etch process. Capping layer 54 such as an oxide is then deposited and planarized to the surface of resist 46. Note that reference numeral 52 represents the wordlines of the inventive DRAM cell array and that the wordlines are arranged in the row direction of the memory cells. The highly-conductive material is formed utilizing a conventional deposition process such as low-pressure chemical vapor deposition.

Next, another photoresist (not shown) is applied to the structure and is subjected to lithography so as to expose mandrel material that is between adjacent deep trenches. A conventional etching process such as reactive-ion etching (RIE) is then performed to remove a portion of mandrel material 40 between the adjacent deep trenches and then bitline contacts 58 which are composed of doped polysilicon, for example, are formed on the remaining portion of the mandrel material providing the structure illustrating in FIG. 6L.

Figure 6M:
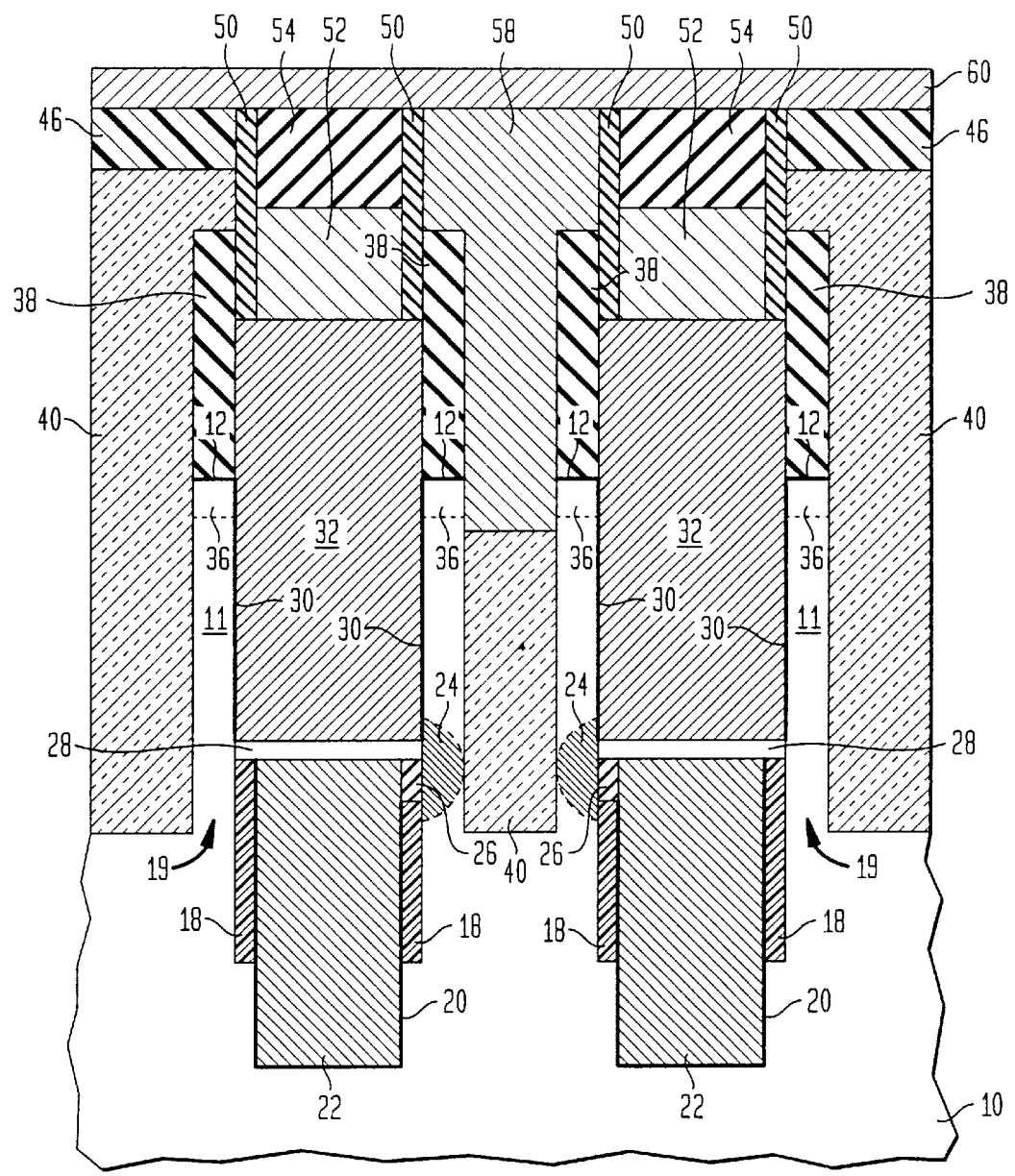
Figure 7A:
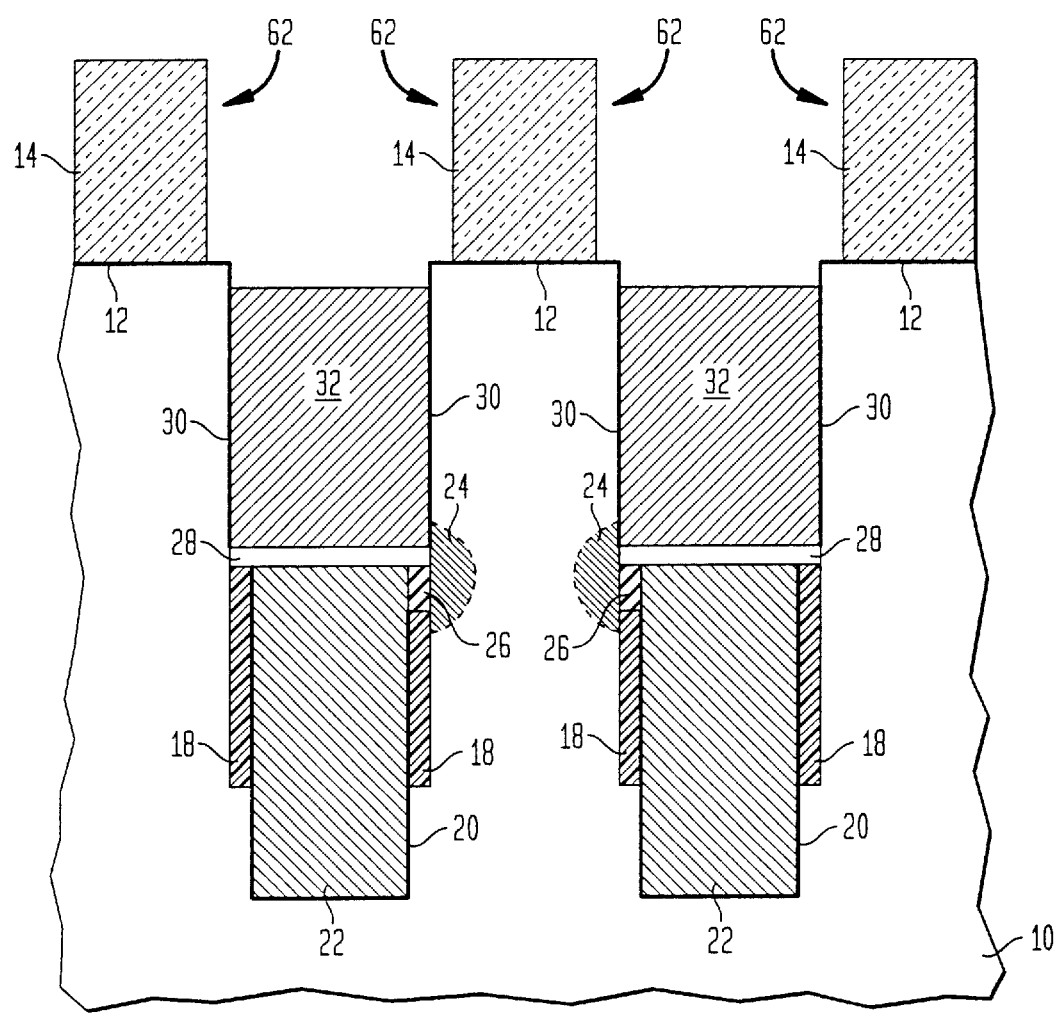
FIGS. 7A–B are cross-sectional views of the inventive vertical DRAM cell array through an alternative embodiment of the present invention.
Figure 7B:
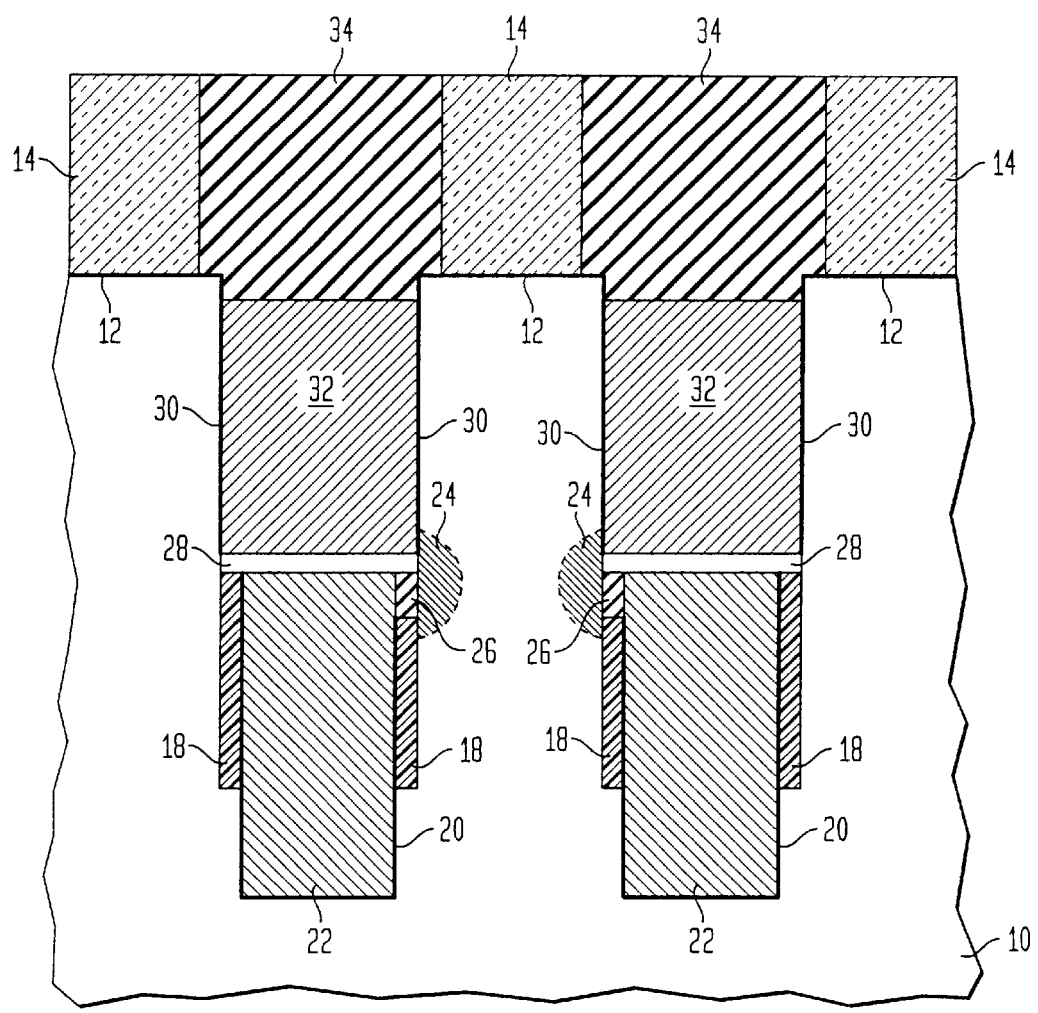

Bitlines 60 which are in contact with bitline contact regions 58 are then formed orthogonal to the wordlines. Specifically, the bitlines are formed by forming bitline barrier layer (not shown in the drawings) such as WN on the upper exposed surfaces of the structure. Thereafter, W or $WSi_X$ (hereinafter referred to as bitline 60) is deposited on the bitline barrier layer and oxide cap (not shown in the drawings) is formed on the bitline. The structure fabricated from these steps of the present invention is shown in FIG. 6M FIGS. 7A–B show an alternative embodiment of the present invention. Specifically, the processes steps which lead to the structure shown in FIG. 6E are first performed. Thereafter, gate conductor 32 is formed in the trench and an isotropic etching process is employed in recessing the gate conductor to a surface below Si-containing substrate 10. Note that during the isotropic etching process some of the hard mask and etch stop pad layer are also removed forming gate regions that have a wider overhang region 62. The resultant structure is shown, for example, in FIG. 7A. In FIG. 7B, insulating capping layer 34 in the recessed and wider overhang regions and the remaining processing steps shown in FIGS. 6G–M are then performed.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the letters patent is:

1. A compact DRAM cell array which comprises:
   a plurality of annular memory cells, which are arranged in rows and columns, each annular memory cell positioned within a trench and including a vertical MOSFET and an underlying capacitor surrounded by an annular ring wherein said vertical MOSFET and said underlying capacitor are in electrical contact to each other through a buried-strap outdiffusion region which is present within a portion of said annular ring of each annular memory cell such that said portion partially encircles said annular memory cell, the remaining portions of said annular ring of each annular memory cell have a body contact region which serves to electrically connect said annular memory cell to an adjacent array well region, said annular ring of each annular memory cell is self-aligned to said trench;
   a plurality of wordlines overlaying said vertical MOSFETS, said plurality of wordlines being arranged in said row direction; and a plurality of bitlines that are orthogonal to said plurality of wordlines.

2. The compact DRAM cell array of claim 1 wherein buried-strap outdiffusion regions of adjacent annular memory cells that are arranged in said columns are facing each other.

3. The compact DRAM cell array of claim 1 wherein buried-strap outdiffusion regions of adjacent annular memory cells in said columns are not facing each other.

4. The compact DRAM cell array of claim 1 wherein buried-strap outdiffusion regions of adjacent annular memory cells in said columns are facing each other, whereas the neighboring pair of annular memory cells in said rows have buried-strap outdiffusion regions that are not facing each other.

5. The compact DRAM cell array of claim 1 further comprising bitline contacts which are formed between adjacent memory cells.

6. The compact DRAM cell array of claim 1 wherein an active area annulus surrounds each annular memory cell.

7. The compact DRAM cell array of claim 6 wherein isolation regions encircle said active area annulus of each annular memory cell.

8. The compact DRAM cell array of claim 1 wherein said buried-strap outdiffusion is partially connected to a collar oxide region which includes a divot region.

9. The compact DRAM cell array of claim 8 wherein said divot region is filled with polysilicon.

10. The compact DRAM cell array of claim 1 wherein diffusion regions encircle a portion of each annular memory cell.

11. The compact DRAM cell array of claim 1 wherein said plurality of annular memory cells have a cell area of sub-$8F^2$.

12. The compact DRAM cell array of claim 1 wherein said vertical MOSFETs include gate dielectrics formed on inner surfaces of said walls of said annular memory cell.

13. The compact DRAM cell array of claim 1 wherein adjacent buried-strap outdiffusion regions are electrically isolated from each other.

14. The compact DRAM cell of claim 1 wherein each vertical MOSFET has a body which is contained within a cylindrical shell such that a cross-section of the vertical MOSFET in a plane perpendicular to an axis of the cylindrical shell is an annulus.

* * * * *